United States Patent
Ryu et al.

(10) Patent No.: US 10,664,083 B2
(45) Date of Patent: May 26, 2020

(54) DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Yonghwan Ryu, Yongin-si (KR); Youngdae Kim, Yongin-si (KR); Heena Kim, Yongin-si (KR); Sangjin Park, Yongin-si (KR); Taehyeok Choi, Yongin-si (KR); Euikang Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/183,157

(22) Filed: Nov. 7, 2018

(65) Prior Publication Data

US 2019/0171318 A1    Jun. 6, 2019

(30) Foreign Application Priority Data

Dec. 1, 2017   (KR) .......................... 10-2017-0164327

(51) Int. Cl.
  *G06F 3/041*   (2006.01)
  *H01L 27/32*   (2006.01)
  (Continued)

(52) U.S. Cl.
  CPC .......... *G06F 3/0412* (2013.01); *G06F 3/0443* (2019.05); *G06F 3/0446* (2019.05);
  (Continued)

(58) Field of Classification Search
  CPC ........ G06F 3/044; G06F 3/0412; G06F 3/041; G06F 2203/04103; G06F 2203/04112;
  (Continued)

(56) References Cited

U.S. PATENT DOCUMENTS

2014/0145979 A1* 5/2014 Lee .................. G06F 3/0412
                                                     345/173
2015/0253810 A1* 9/2015 Shin ................. G06F 1/16
                                                     345/174

(Continued)

FOREIGN PATENT DOCUMENTS

KR   10-2015-0053725 A   5/2015
KR   10-2016-0022727 A   3/2016
(Continued)

*Primary Examiner* — Dong Hui Liang
(74) *Attorney, Agent, or Firm* — Lewis Roca Rothgerber Christie LLP

(57) ABSTRACT

A display apparatus includes an encapsulation layer, a display device, a touch layer, and an organic insulating layer. The encapsulation layer is on and covers the display device. The touch layer is above the encapsulation layer and includes a plurality of sensing electrodes, each of which includes a conductive layer having a first metal layer, a second metal layer above the first metal layer, and a third metal layer between the first metal layer and the second metal layer and exposed side surfaces. The organic insulating layer is above and covers the touch layer and is spaced apart from the side surfaces of the third metal layer.

20 Claims, 6 Drawing Sheets

(51) Int. Cl.
*H01L 51/52* (2006.01)
*G06F 3/044* (2006.01)
(52) U.S. Cl.
CPC ........ *G06F 3/04164* (2019.05); *H01L 27/323* (2013.01); *H01L 27/3246* (2013.01); *H01L 27/3276* (2013.01); *H01L 51/5203* (2013.01); *H01L 51/5246* (2013.01); *H01L 51/5253* (2013.01); *G06F 2203/04103* (2013.01); *G06F 2203/04111* (2013.01); *G06F 2203/04112* (2013.01)
(58) Field of Classification Search
CPC ............... H01L 27/323; H01L 27/3276; H01L 51/5253; H01L 51/56; G01L 51/5253; G01L 51/56
See application file for complete search history.

(56) References Cited

U.S. PATENT DOCUMENTS

| | | | |
|---|---|---|---|
| 2016/0315284 A1 | 10/2016 | Jeon | |
| 2018/0061898 A1* | 3/2018 | Oh | ........................ H01L 27/322 |
| 2018/0101258 A1* | 4/2018 | Cho | ........................ G06F 3/041 |

FOREIGN PATENT DOCUMENTS

| | | |
|---|---|---|
| KR | 10-2016-0092432 A | 8/2016 |
| KR | 10-2016-0127873 A | 11/2016 |
| KR | 10-2017-0009602 A | 1/2017 |

* cited by examiner

DISPLAY APPARATUS AND METHOD OF MANUFACTURING THE SAME

CROSS-REFERENCE TO RELATED APPLICATION

Korean Patent Application No. 10-2017-0164327, filed on Dec. 1, 2017, and entitled, "Display Apparatus and Method of Manufacturing the Same," is incorporated by reference herein in its entirety.

BACKGROUND

1. Field

One or more embodiments described herein relate to a display apparatus and a method for manufacturing a display apparatus.

2. Description of the Related Art

An image display apparatus may include a touch layer for converting the position of a touch on a display screen to electrical signals that correspond to a user commands. Such a touch layer is provided at a front face of the image display apparatus. The touch may be generated by a human finger, stylus, or other object.

Many types of touch layers have been developed. Examples include resistive overlay-type touch layers, photosensitive-type touch layers, and capacitance-type touch layers. Capacitance-type touch layers sense a change in capacitance between a conductive sensing electrode and another sensing electrode, a ground electrode, etc. The change in capacitance results from a touch on the display screen. These types of touch layers have been used in lieu of resistive overlay-type touch layers for some applications. In some cases, the sensing electrodes in a capacitance-type touch layer have transparent properties in order to allow a display screen below the sensing electrodes to be visible.

SUMMARY

In accordance with one or more embodiments, a display apparatus includes a substrate; a display device on the substrate; an encapsulation layer on and covering the display device; a touch layer above the encapsulation layer and including a plurality of sensing electrodes, each of the plurality of sensing electrodes including a conductive layer which includes a first metal layer, a second metal layer above the first metal layer, and a third metal layer between the first metal layer and the second metal layer and having exposed side surfaces; and an organic insulating layer above and covering the touch layer and spaced apart from the side surfaces of the third metal layer.

The side surfaces of the third metal layer may have an undercut structure where the side surfaces are recessed in an inward direction relative to ends of the first metal layer and the second metal layer. The side surfaces of the third metal layer may be recessed toward the inside to have a curved surface.

Spaces may exist between respective ones of the side surfaces of the third metal layer and the organic insulating layer. Each of the spaces may be surrounded by a respective one of the side surfaces of the third metal layer and at least a portion of the organic insulating layer. Each of the spaces maybe surrounded by a respective one of the side surfaces of the third metal layer, at least a portion of the organic insulating layer, at least a portion of the first metal layer, and at least a portion of the second metal layer.

The organic insulating layer may contact at least one of the first metal layer and the second metal layer, but does not contact the third metal layer. The third metal layer may have an upper surface, a lower surface, and the side surfaces connecting the upper surface and the lower surface, the lower surface of the third metal layer may contact the first metal layer, the upper surface of the third metal layer may contact the second metal layer, and the side surfaces of the third metal layer may not contact all of the first metal layer, the second metal layer, and the organic insulating layer.

An inorganic insulating layer may be between the encapsulation layer and the touch layer, and the touch layer may be above the inorganic insulating layer. The organic insulating layer may include a low temperature organic material having a curing temperature equal to or lower than 100° C. The first metal layer and the second metal layer may include Ti and the third metal layer may include Al.

Each of the plurality of sensing electrodes may include a plurality of first sensing cells arranged in a first direction, and a plurality of second sensing cells arranged in a second direction crossing the first direction. Each of the plurality of first sensing cells and the plurality of second sensing cells may have a mesh structure. The third metal layer may have an upper surface, a lower surface, and the side surfaces connecting the upper surface and the lower surface, and the lower surface of the third metal layer may contact the first metal layer and the upper surface of the third metal layer contacts the second metal layer.

In accordance with one or more other embodiments, a display apparatus includes a display panel including a thin film transistor above a substrate, a display device electrically connected to the thin film transistor, and an encapsulation layer covering the display device; and a touch layer directly above the display panel and including an organic insulating layer above and covering a conductive layer, the conductive layer having a multilayer structure which includes a first metal layer, a second metal layer, and a third metal layer that are sequentially stacked, wherein spaces are between the organic insulating layer and respective side surfaces of the third metal layer.

In accordance with one or more other embodiments, a method for manufacturing a display apparatus includes forming a display panel by forming, on a substrate, a thin film transistor, a display device electrically connected to the thin film transistor, and an encapsulation layer covering the display device; forming a conductive layer above the display panel, the conductive layer including a first metal layer, a second metal layer above the first metal layer, and a third metal layer between the first metal layer and the second metal layer; forming a plurality of sensing electrodes by patterning the conductive layer, the third metal layer of the conductive layer having an undercut portion in which side surfaces of the third metal layer are recessed in an inward direction relative to ends of the first metal layer and the second metal layer; and forming an organic insulating layer on the plurality of sensing electrodes.

The undercut portion of the organic insulating layer may not be filled during formation of the organic insulating layer. Patterning the conductive layer may include forming spaces between respective side surfaces of the third metal layer and the organic insulating layer. The method may include, before forming the conductive layer, forming an inorganic insulating layer above the encapsulation layer of the display panel. Forming the organic insulating layer may include forming the organic insulating layer using a low temperature organic material having a curing temperature equal to or lower than 100° C.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
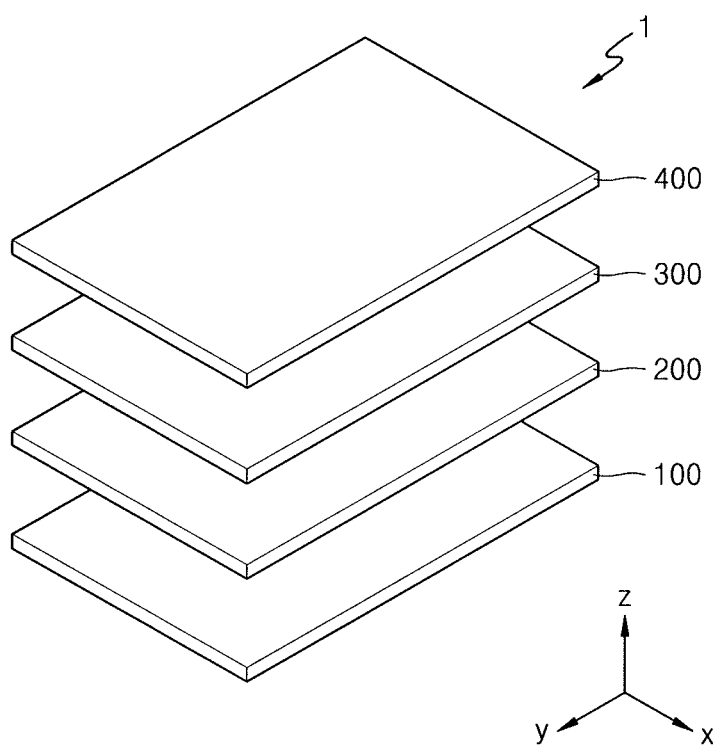
FIG. 1 illustrates an embodiment of a display apparatus.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are only used to distinguish one component from another. As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component, e.g., intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 illustrates an embodiment of a display apparatus 1 which may include a display panel 100, a touch layer (or panel) 200 above the display panel 100, a polarization unit 300 above the touch layer 200, and a cover window 400 above the polarization unit 300. According to an embodiment, an adhesion layer may be between the display panel 100 and the touch layer 200, between the touch layer 200 and the polarization unit 300, and/or between the polarization unit 300 and the cover window 400. In one embodiment, the polarization unit 300 may be between the display panel 100 and the touch layer 200. The touch layer 200 may be coupled onto the display panel 100 as an additional panel, for example, using an adhesive, or may be provided integrally with the display panel 100, e.g., embedded in the display panel 100.

Figure 2:
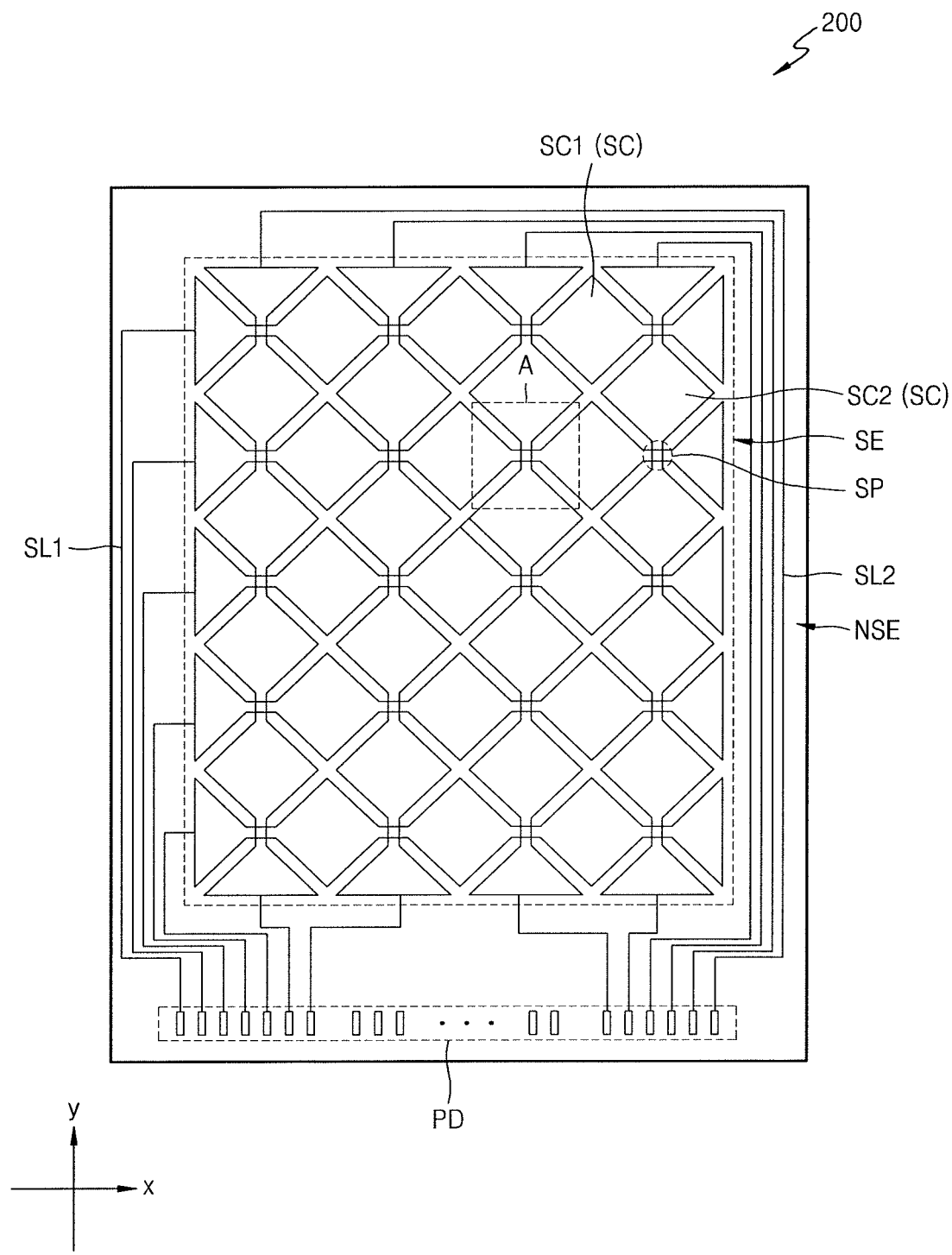
FIG. 2 illustrates an embodiment of a touch layer.
Figure 3:
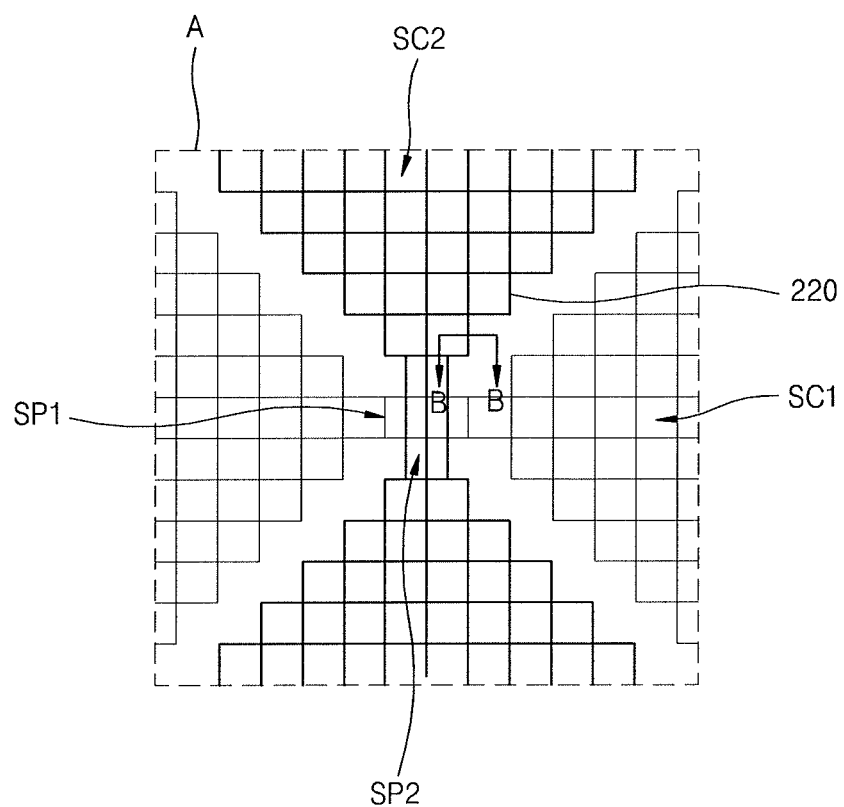
FIG. 3 illustrates an embodiment of portion A of the touch layer.

FIG. 2 illustrates an embodiment of the touch layer 200, and FIG. 3 illustrates an enlarged view of portion A of the touch layer 200 according to an embodiment. Referring to FIGS. 2 and 3, the touch layer 200 may include a plurality of sensing electrodes SC electrically connected to one another via connection patterns SP. First location detection lines SL1 and second location detection lines SL2 may connect the plurality of sensing electrodes SC to an external driving circuit via a pad unit PD. The first and second location detection lines SL1 and SL2 may be at an outer portion of the plurality of sensing electrodes SC.

According to an embodiment, the touch layer 200 may be provided as an additional panel. In this case, the sensing electrodes SC and the connection patterns SP may be formed on an additional transparent substrate. According to one embodiment, the touch layer 200 may be directly formed on the display panel 100 rather than being provided as an additional panel. In this case, the sensing electrodes SC and the connection patterns SP may be formed above an encapsulation unit (or layer) 170.

The plurality of sensing electrodes SC may include first sensing cells SC1 connected to each other in a first (X-axis) direction, and second sensing cells SC2 connected to each other in a second (Y-axis) direction crossing the first direction. The second sensing cells SC2 may be arranged and distributed between the first sensing cells SC1 so as not to overlap the first sensing cells SC1. In one embodiment, the first sensing cells SC1 and the second sensing cells SC2 are arranged to be distributed in a touch activation region SE as a staggered stacking type not to overlap each other.

As indicated, the first direction in which the first sensing cells SC1 are connected to each other and the second direction in which the second sensing cells SC2 are connected to each other are different directions crossing each other. For example, when the first direction is a row direction, the second direction may be a column direction.

In one embodiment, multiple first sensing cells SC1 may be arranged in a column line and/or a row line. The first sensing cells SC1 in an equal column line or an equal row line may be connected to each other in the first direction via a plurality of first connection patterns SP1 arranged in the equal column line or the equal row line. The first sensing cells SC1 may be connected to the first location detection lines SL1, respectively, in a unit of a line connected in the first direction.

Also, multiple second sensing cells SC2 may be arranged in a row line and/or a column line. The second sensing cells SC2 located in an equal row line or an equal column line may be connected to each other in the second direction, crossing the first direction, via a plurality of second connection patterns SP2 arranged in the equal row line or the equal column line. The second sensing cells SC2 may be connected to the second location detection lines SL2, respectively, in a unit of a line connected in the second direction.

The first sensing cells SC1 and the second sensing cells SC2 may be transparent in order to have a transmittance equal to or greater than a predetermined transmittance. As a result, light from the display panel 100 from below the first sensing cells SC1 and the second sensing cells SC2 may be transmitted to the first sensing cells SC1 and the second sensing cells SC2. For example, the first sensing cells SC1 and the second sensing cells SC2 may include a transparent electrode layer including at least a transparent electrode material, such as ITO.

According to the embodiment illustrated in FIG. 3, each of the first sensing cells SC1 and the second sensing cells SC2 may have a mesh structure with a predetermined light-transmittance. The first sensing cells SC1 and the second sensing cells SC2 may include a low resistive material, e.g., Mo, Ag, Ti, Cu, Al, Mo/Al/Mo, etc.

The connection patterns SP may include the plurality of first connection patterns SP1 (multiple first connection patterns SP1 may be formed in the first direction) to connect the first sensing cells SC1 in the first direction and the plurality of second connection patterns SP2 (multiple second connection patterns SP2 may be formed in the second direction) to connect the second sensing cells SC2 in the second direction. The connection patterns SP may include a transparent electrode material or a non-transparent low resistive electrode material, with a thickness, a width, area, or other size adjusted to prevent visualization.

The first location detection lines SL1 and the second location detection lines SL2 may be electrically connected to the first sensing cells SC1 and the second sensing cells SC2, respectively. The first sensing cells SC1 are connected to each other in the first direction and the second sensing cells SC2 are connected to each other in the second direction in the unit of a line. The first location detection lines SL1 and the second location detection lines SL2 may connect the first sensing cells SC1 and the second sensing cells SC2 to an external driving circuit (e.g., a location detection circuit) via the pad unit PD. The first location detection lines SL1 and the second location detection lines SL2 may be in a touch-non activation region NSE outside the touch activation region SE, which circumvents the touch activation region SE in which an image is displayed. The first location detection lines SL1 and the second location detection lines SL2 may include, for example, a low resistive material (e.g., Mo, Ag, Ti, Cu, Al, Mo/Al/Mo, etc.) and/or a transparent electrode material, which, for example, may be used to form the first sensing cells SC1 and second sensing cells SC2.

FIG. 2 illustrates an embodiment where the first connection patterns SP1 and the second connection patterns SP2 cross each other. In one embodiment, the first connection patterns SP1 may connect the first sensing cells SC1 in the first direction, but may not cross the second connection patterns SP2 by detouring to a path overlapping the second sensing cells SC2 adjacent to the first connection patterns SP1. In this case, an insulating layer may be between the first connection patterns SP1 and the second sensing cells SC2 to secure stability.

Figure 4:
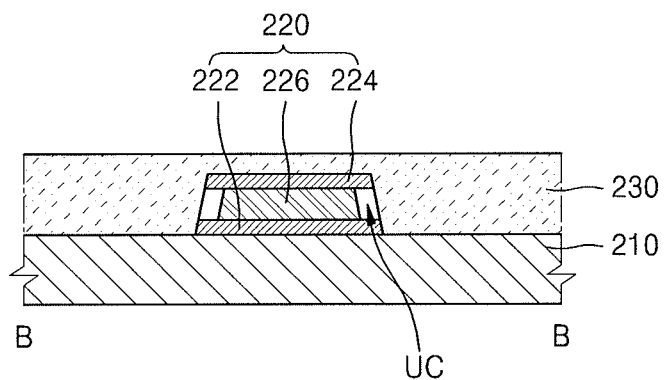
FIG. 4 illustrates an embodiment taken along line B-B in FIG. 3.
Figure 5:
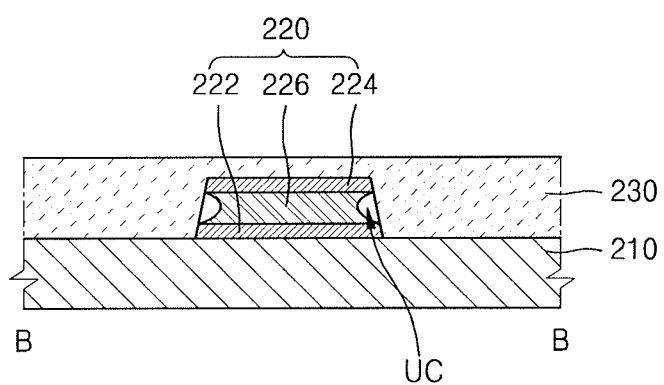
FIG. 5 illustrates another embodiment taken along section line B-B in FIG. 3.

FIG. 4 illustrates an embodiment of the touch layer 200 taken along section line B-B in FIG. 3. FIG. 5 illustrates another embodiment of the touch layer 200 taken along the line B-B in FIG. 3.

In the touch layer 200 of FIG. 4, the plurality of sensing electrodes SC may include a conductive layer 220, which includes a first metal layer 222, a second metal layer 224, and a third metal layer 226. The conductive layer 220 may be on an inorganic insulating layer 210. The inorganic insulating layer 210 may be on the encapsulation unit 170 (e.g., refer to FIG. 6) of the display panel 100. The conductive layer 220 may be above the inorganic insulating layer 210. The inorganic insulating layer 210 may serve as a substrate on which the sensing electrodes SC are arranged. The inorganic insulating layer 210 may include a single layer or multiple layers including an inorganic material, e.g., silicon oxide, silicon nitride, and/or silicon oxynitride.

The conductive layer 220 may include the first metal layer 222, the second metal layer 224, and the third metal layer 226. The first metal layer 222 may be on the inorganic insulating layer 210. The second metal layer 224 may be above the first metal layer 222. The third metal layer 226 may be between the first metal layer 222 and the second metal layer 224. The first metal layer 222, the second metal layer 224, and the third metal layer 226 may include an electrically conductive metal, e.g., a low resistive electrically conductive material. The first metal layer 222, the second metal layer 224, and the third metal layer 226 may include, for example, Mo, Ag, Ti, Cu, Al, Mo/Al/Mo, or a combination thereof.

Thus, in one embodiment, the conductive layer 220 may have a triple-layer structure in which the first metal layer 222, the second metal layer 224, and the third metal layer 226 are stacked. Side surfaces of the third metal layer 226 between the first metal layer 222 and the second metal layer 224 may be exposed. For example, the third metal layer 226 may be between the first metal layer 222 and the second metal layer 224, a lower surface of the third metal layer 226 may contact the first metal layer 222, and an upper surface of the third metal layer 226 may contact the second metal layer 224. The side surfaces of the third metal layer 226 (e.g., side surfaces connecting the upper and lower surfaces of the third metal layer 226) may not contact the first metal layer 222 or the second metal layer 224. The third metal layer 226 may be sandwiched between the first metal layer 222 and the second metal layer 224.

An organic insulating layer 230 may be on the conductive layer 220 to cover the conductive layer 220. According to the one embodiment, each of the side surfaces of the third metal layer 226 and the organic insulating layer 230 may be spaced apart from each other by a certain distance. For example, as illustrated in FIG. 4, a space UC may be between a respective one of the side surfaces of the third metal layer 226 and the organic insulating layer 230. Since the organic insulating layer 230 is arranged on and covers the conductive layer 220, the organic insulating layer 230 may contact at least one of the first metal layer 222 and the second metal layer 224, but may not contact the third metal layer 226. According to an embodiment, the organic insulating layer 230 may include a low temperature organic material with a curing temperature equal to or lower than a predetermined temperature, e.g., 100° C.

The structure of the space UC may result, for example, from an undercut structure of the third metal layer 226, which may be formed in a process in which the first metal layer 222, the third metal layer 226, and the second metal layer 224 are sequentially stacked and patterned. For example, in one type of etching process, side surfaces of the conductive layer 220 may be constantly etched to form a triple-layer structure. However, in the conductive layer 220 according to the present embodiment, etching may be performed such that the third metal layer 226 has an undercut structure, e.g., side surfaces of the third metal layer 226 may be recessed toward the inside compared to ends of the first metal layer 222 and the second metal layer 224.

As described above, since the third metal layer 226 has an undercut structure, the space UC may be formed between the organic insulating layer 230 and respective side surfaces of the third metal layer 226, which are recessed in an inward direction relative to the ends of the first metal layer 222 and the second metal layer 224. The space UC may be, for example, an empty space between respective side surfaces of the third metal layer 226 and the organic insulating layer 230, where no component is located.

In one embodiment, the conductive layer 220 may have the triple-layer structure as described above. According to an embodiment, the first metal layer 222 and the second metal layer 224 may include Ti, and the third metal layer 226 between the first metal layer 222 and the second metal layer 224 may include Al. In this case, the third metal layer 226 between the first metal layer 222 and the second metal layer 224 may have relatively low adhesion to the organic insulating layer 230, compared to the first metal layer 222 and the second metal layer 224. In this case, swelling of the organic insulating layer 230 may occur where the organic insulating layer 230 and third metal layer 226 having relatively low adhesion to the organic insulating layer 230 contact each other. This may cause defects in the touch layer 200.

Thus, according to one embodiment of display apparatus 1, the third metal layer 226 (which may have relatively poor adhesion to the organic insulating layer 230) is spaced apart from the organic insulating layer 230 to prevent the swelling phenomenon of the organic insulating layer 230 and improve reliability of the touch layer 200.

Referring to FIG. 5, the touch layer 200 of this embodiment may have the same general structure as the embodiment of FIG. 4, except for the side surfaces of the third metal layer 226. According to the embodiment of FIG. 5, the side surfaces of the third metal layer 226 may include a curved surface that is recessed in an inward direction.

Figure 6:
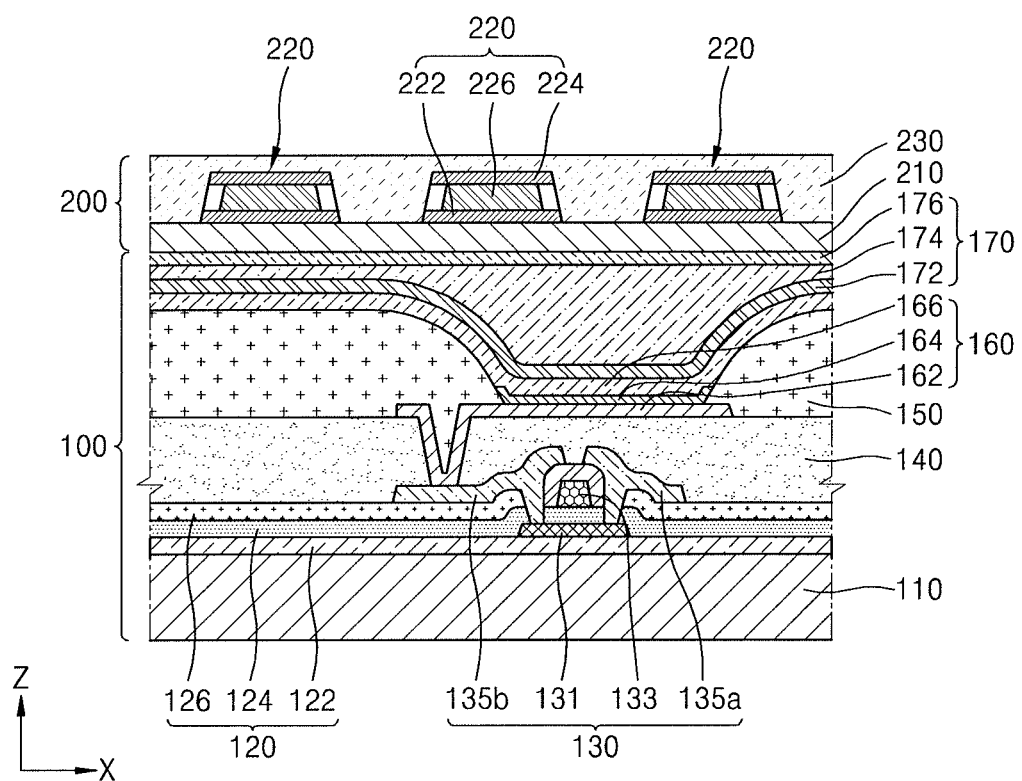
FIG. 6 illustrates another embodiment of a display apparatus.

FIG. 6 illustrates a cross-sectional view of a portion of the display apparatus 1 according to one embodiment. In FIG. 6, an enlarged section of the display panel 100 of the display apparatus 1 is illustrated, e.g., a section of a pixel (or a sub-pixel) including an organic light-emitting device 160 is schematically illustrated.

The display panel 100 may include a substrate 110, the organic light-emitting device 160 electrically connected to a thin film transistor 130 on the substrate 110, and the encapsulation unit (or layer) 170 encapsulating the organic light-emitting device 160. The substrate 110 may include various materials having a flexible or bendable property. For example, the substrate 110 may include a polymer resin such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The thin film transistor 130 may be on the substrate 110 and may include a semiconductor layer 131, a gate electrode 133, a source electrode 135a, and a drain electrode 135b. The semiconductor layer 131 may include amorphous silicon, polycrystalline silicon, or an organic semiconductor material.

A gate insulating layer 124 including an inorganic material (e.g., silicon oxide, silicon nitride, and/or silicon oxynitride) may be between the semiconductor layer 131 and the gate electrode 133 in order to provide insulation between the semiconductor layer 131 and the gate electrode 133. An interlayer insulating layer 126 including an inorganic material (e.g., silicon oxide, silicon nitride, and/or silicon oxynitride) may be above the gate electrode 133. The source electrode 135a and the drain electrode 135b may be on the interlayer insulating layer 126. The gate insulating layer 124 and the interlayer insulating layer 126 including inorganic materials may be formed by chemical vapor deposition (CVD), atomic layer deposition (ALD), or another process.

A buffer layer 122 including an inorganic material (e.g., silicon oxide, silicon nitride, and/or silicon oxynitride) may be between the thin film transistor 130 and the substrate 110 having this structure. The buffer layer 122 may planarize an upper surface of the substrate 110 and prevent impurities from the substrate 110, etc., from penetrating into the semiconductor layer 131 of the thin film transistor 130, or at least reduce or minimize impurity penetration.

A planarization layer 140 may be on the thin film transistor 130. When, for example, the organic light-emitting device 160 is above the thin film transistor 130 as illustrated in FIG. 6, the planarization layer 140 may generally planarize an upper portion of a protective layer covering the thin film transistor 130. The planarization layer 140 may include, for example, an organic material such as acryl, benzocyclobutene (BCB), hexamethyldisiloxane (HMDSO), or the like. The planarization layer 140 has a single-layer in FIG. 6, but may include multiple layers in another embodiment.

The organic light-emitting device 160 may be on the planarization layer 140 and may include a pixel electrode 162, an opposite electrode 166, and an intermediate layer 164 between the pixel electrode 162 and the opposite electrode 166. The intermediate layer 164 includes an emission layer. The pixel electrode 162 may be electrically connected to the thin film transistor 130 by contacting the source electrode 135a or the drain electrode 135b through an opening in the planarization layer 140, etc., for example, as illustrated in FIG. 6.

A pixel-defining layer 150 may be above the planarization layer 140 and may define a pixel by having an opening corresponding to each of sub-pixels, e.g., an opening exposing at least a central portion of the pixel electrode 162. Also, as in the embodiment of FIG. 6, the pixel-defining layer 150 may prevent an occurrence of arcs, etc., at an edge of the pixel electrode 162 by increasing the distance between the edge of the pixel electrode 162 and the opposite electrode 166 above the pixel electrode 162. The pixel-defining layer 150 may include an organic material, e.g., PI or HMDSO.

The intermediate layer 164 of the organic light-emitting device 160 may include a low molecular weight material or a high molecular weight material. When the intermediate layer 164 includes a low molecular weight material, the intermediate layer 164 may have a structure in which a single layer or multiple layers (e.g., one or more of a hole injection layer (HIL), a hole transport layer (HTL), an emission layer (EML), an electron transport layer (ETL), an electron injection layer (EIL)) are stacked. The single layer or one or more of the multiple layers of the intermediate layer 164 may include various organic materials. Examples include copper phthalocyanine (CuPc), (N,N'-Di (naphthalene-1-yl)-N,N-diphenyl-benzidine) (NPB), tris-8-hydroxy-quinoline aluminum (Alq3), etc. The single or multiple layers may be formed, for example, by a vapor deposition process.

When the intermediate layer 164 includes a high molecular weight material, the intermediate layer 164 may generally have a structure including HTL and EML. The HTL may include PEDOT. The EML may include a polymer material, e.g., a poly-phenylenevinylene (PPV)-based material, a polyfluorene-based material, etc. The intermediate layer 164 may be formed, for example, by screen printing, inkjet printing, laser-induced thermal imaging (LITI), etc.

In one embodiment, the intermediate layer 164 may include various other structures. Also, the intermediate layer 164 may include an integrated layer throughout the plurality of pixel electrodes 162 or may include patterned layers corresponding to the plurality of pixel electrodes 162, respectively.

The opposite electrode 166 may be on the intermediate layer 164, may be integrally formed with respect to the plurality of organic light-emitting devices 160, and may correspond to the plurality of pixel electrodes 162.

Without the encapsulation unit 170, the organic light-emitting device 160 may be easily damaged due to water or oxygen from the outside. The encapsulation unit 170 may cover the organic light-emitting device 160 to protect the organic light-emitting device 160. The encapsulation unit 170 may be arranged throughout the substrate 110 and, in one embodiment, may extend to an edge of the substrate 110.

The encapsulation unit 170 may include a first inorganic encapsulation layer 172, an organic encapsulation layer 174, and a second inorganic encapsulation layer 176 as illustrated in FIG. 6. The first inorganic encapsulation layer 172 may cover the opposite electrode 166 and may include, for example, silicon oxide, silicon nitride, and/or silicon oxynitride. In one embodiment, one or more additional layers (e.g., a capping layer, etc.) may be between the first inorganic encapsulation layer 172 and the opposite layer 166.

The first inorganic encapsulation layer 172 may be formed along a structure below the first inorganic encapsulation layer 172. Thus, as illustrated in FIG. 6, the first inorganic encapsulation layer 172 (e.g., at least an upper surface thereof) may not be flat or planar. The organic encapsulation layer 174 may cover the first inorganic encapsulation layer 172. Unlike the first inorganic encapsulation layer 172, the organic encapsulation layer 174 may generally have a planarized upper surface. The organic encapsulation layer 174 may include one or more materials, e.g., one or more of PET, PEN, PC, PI, polyethyelen sulfonate, polyoxymethylene, polyarylate, and HMDSO.

The second inorganic encapsulation layer 176 may cover the organic encapsulation layer 174 and include, for example, silicon oxide, silicon nitride, and/or silicon oxynitride. The second inorganic encapsulation layer 176 may contact the first inorganic encapsulation layer 172 at an edge of the substrate 110 so that the organic encapsulation layer 174 is not exposed to the outside.

Since the encapsulation unit 170 includes the first inorganic encapsulation layer 172, the organic encapsulation layer 174, and the second inorganic encapsulation layer 176, even if cracks occur in the encapsulation unit 170, the multilayer structure of the encapsulation unit 170 may not allow cracks to be connected between the first inorganic encapsulation layer 172 and the organic encapsulation layer 174 or between organic encapsulation layer 174 and the second inorganic encapsulation layer 176. Thus, the formation of a path through which water or oxygen from the outside may penetrate into the display panel 100 may be reduced or minimized.

The touch layer 200 may be above the display panel 100. FIG. 6 illustrates that the touch layer 200 is located directly on the display panel 100. In one embodiment, one or more function layers (e.g., a capping layer, an adhesion layer, etc.) may be between the display panel 100 and the touch layer 200. The touch layer 200 may be manufactured on a transparent substrate as an additional panel and may be laminated to the display panel 100, or the touch layer 200 may be formed by directly forming patterns on the display panel 100.

Figure 7:
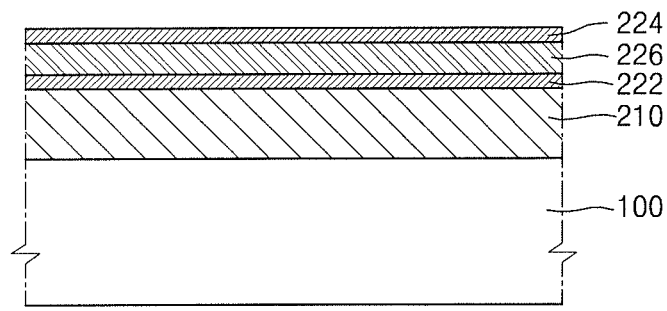
FIGS. 7 to 9 illustrate stages corresponding to an embodiment of a method for manufacturing a display apparatus.
Figure 8:
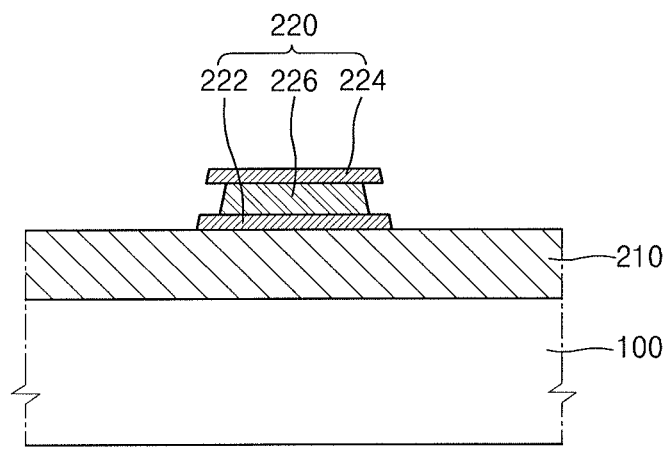
Figure 9:
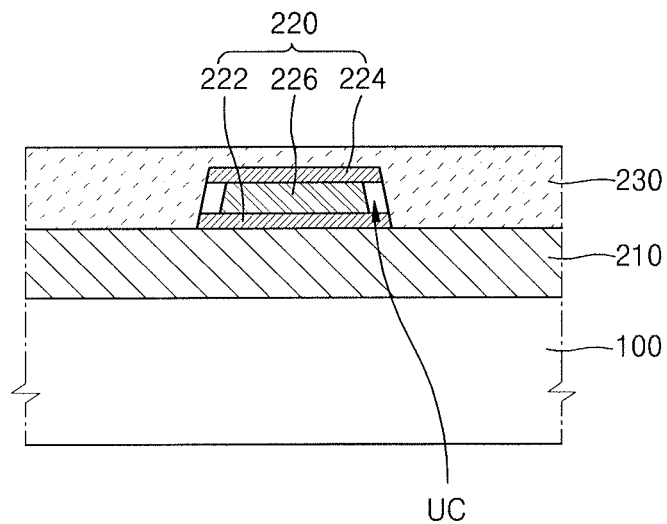

FIGS. 7 to 9 illustrate cross-sectional views of various stages of a method for manufacturing a display apparatus 1 according to an embodiment. The display apparatus may be, for example, display apparatus 1.

First, as described in FIG. 6, display devices (such as a thin film transistor and an organic light-emitting device) and the encapsulation unit 170 covering the display devices may be formed on a substrate in order to manufacture the display panel 100. Inorganic insulating layer 210 may be formed on the encapsulation unit 170, and the conductive layer 220 may be formed on the inorganic insulating layer 210.

Referring to FIG. 7, the first metal layer 222, the third metal layer 226, and the second metal layer 224 may be sequentially formed. The first metal layer 222 may be formed on the inorganic insulating layer 210. The third metal layer 226 may be formed on the first metal layer 222. The second metal layer 224 may be formed on the third metal layer 226. As described above, the first metal layer 222, the second metal layer 224, and the third metal layer 226 may include a low resistive material, e.g., Mo, Ag, Ti, Cu, Al, Mo/Al/Mo, etc. According to the present embodiment, the first metal layer 222 and the second metal layer 224 may include Ti and the third metal layer 226 may include Al.

Thereafter, referring to FIG. 8, one or more of the first metal layer 222, the second metal layer 224, and the third metal layer 226 may be simultaneously etched to form the conductive layer 220. The third metal layer 226 may be formed to have an undercut structure, in which the third metal layer 226 is recessed in an inward direction relative to ends of the first metal layer 222 and the second metal layer 224. The undercut structure may be formed, for example, by changing one or more process conditions during the etching.

Thereafter, referring to FIG. 9, the organic insulating layer 230 may be formed on the conductive layer 220, formed by etching one or more of the first metal layer 222, the second metal layer 224, and the third metal layer 226. The spaces UC between the organic insulating layer 230 and respective side surfaces of the third metal layer 226 may be formed so that the third metal layer 226 may not contact the organic insulating layer 230. In a process of coating the conductive layer 220 with the organic insulating layer 230, due to viscosity of the organic insulating layer 230, the organic insulating layer 230 may not be buried in the undercut structure of the side surfaces of the third metal layer 226. Thus, the spaces UC may be naturally formed between respective the side surfaces of the third metal layer 226 and the organic insulating layer 230.

In one embodiment, the conductive layer 220 may have the triple-layer structure as described above. In one embodiment, the first metal layer 222 and the second metal layer 224 may include Ti and the third metal layer 226 may include Al. The third metal layer 226 (arranged between the first metal layer 222 and the second metal layer 224) may have poor adhesion to the organic insulating layer 230, compared to the first metal layer 222 and the second metal layer 224. In this case, swelling of the organic insulating layer 230 may occur at a portion in which the third metal layer 226 having relatively poor adhesion and the organic insulating layer 230 contact each other. This may cause defects in the touch layer 200.

However, according to the display apparatus of the present embodiment, the third metal layer 226 (which has poor adhesion to the organic insulating layer 230) may be arranged to be apart from the organic insulating layer 230. This may prevent swelling of the organic insulating layer 230 and increase general reliability of the touch layer 200.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display apparatus, comprising:
   a substrate;
   a display device on the substrate;
   an encapsulation layer on and covering the display device;
   a touch layer above the encapsulation layer and including a plurality of sensing electrodes, each of the plurality of sensing electrodes including a conductive layer which includes a first metal layer, a second metal layer above the first metal layer, and a third metal layer between the first metal layer and the second metal layer and having exposed side surfaces; and
   an organic insulating layer above and covering the touch layer and spaced apart from the side surfaces of the third metal layer.

2. The display apparatus as claimed in claim 1, wherein spaces exist between respective ones of the side surfaces of the third metal layer and the organic insulating layer.

3. The display apparatus as claimed in claim 2, wherein each of the spaces is surrounded by a respective one of the side surfaces of the third metal layer and at least a portion of the organic insulating layer.

4. The display apparatus as claimed in claim 2, wherein each of the spaces is surrounded by a respective one of the side surfaces of the third metal layer, at least a portion of the organic insulating layer, at least a portion of the first metal layer, and at least a portion of the second metal layer.

5. The display apparatus as claimed in claim 1, wherein:
   the side surfaces of the third metal layer have an undercut structure where the side surfaces are recessed in an inward direction relative to ends of the first metal layer and the second metal layer.

6. The display apparatus as claimed in claim 5, wherein the side surfaces of the third metal layer are recessed toward an inside to have a curved surface.

7. The display apparatus as claimed in claim 1, wherein the organic insulating layer contacts at least one of the first metal layer and the second metal layer, but does not contact the third metal layer.

8. The display apparatus as claimed in claim 7, wherein:
   the third metal layer has an upper surface, a lower surface, and the side surfaces connecting the upper surface and the lower surface,
   the lower surface of the third metal layer contacts the first metal layer,
   the upper surface of the third metal layer contacts the second metal layer, and
   the side surfaces of the third metal layer do not contact all of the first metal layer, the second metal layer, and the organic insulating layer.

9. The display apparatus as claimed in claim 1, wherein each of the plurality of sensing electrodes includes:
   a plurality of first sensing cells arranged in a first direction, and
   a plurality of second sensing cells arranged in a second direction crossing the first direction.

10. The display apparatus as claimed in claim 9, wherein each of the plurality of first sensing cells and the plurality of second sensing cells has a mesh structure.

11. The display apparatus as claimed in claim 1, wherein:
    an inorganic insulating layer is between the encapsulation layer and the touch layer, and
    the touch layer is above the inorganic insulating layer.

12. The display apparatus as claimed in claim 1, wherein the organic insulating layer includes a low temperature organic material having a curing temperature equal to or lower than 100° C.

13. The display apparatus as claimed in claim 1, wherein:
    the first metal layer and the second metal layer include Ti, and
    the third metal layer includes Al.

14. The display apparatus as claimed in claim 1, wherein:
    the third metal layer has an upper surface, a lower surface, and the side surfaces connecting the upper surface and the lower surface, and
    the lower surface of the third metal layer contacts the first metal layer and the upper surface of the third metal layer contacts the second metal layer.

15. A method for manufacturing a display apparatus, the method comprising:
    forming a display panel by forming, on a substrate, a thin film transistor, a display device electrically connected to the thin film transistor, and an encapsulation layer covering the display device;
    forming a conductive layer above the display panel, the conductive layer including a first metal layer, a second metal layer above the first metal layer, and a third metal layer between the first metal layer and the second metal layer;
    forming a plurality of sensing electrodes by patterning the conductive layer, the third metal layer of the conductive layer having an undercut portion in which side surfaces of the third metal layer are recessed in an inward direction relative to ends of the first metal layer and the second metal layer; and forming an organic insulating layer on the plurality of sensing electrodes such that spaces are formed between a side surface of the third metal layer and the organic insulating layer.

16. The method as claimed in claim 15, wherein the undercut portion of the organic insulating layer is not filled during formation of the organic insulating layer.

17. The method as claimed in claim 16, wherein patterning the conductive layer includes forming the spaces between the respective side surfaces of the third metal layer and the organic insulating layer.

18. The method as claimed in claim 15, further comprising before forming the conductive layer:

forming an inorganic insulating layer above the encapsulation layer of the display panel.

19. The method as claimed in claim 15, wherein forming the organic insulating layer includes forming the organic insulating layer using a low temperature organic material having a curing temperature equal to or lower than 100° C.

20. A display apparatus, comprising:

a display panel including a thin film transistor above a substrate, a display device electrically connected to the thin film transistor, and an encapsulation layer covering the display device; and a touch layer directly above the display panel and including an organic insulating layer above and covering a conductive layer, the conductive layer having a multilayer structure which includes a first metal layer, third metal layer, and a second metal that are sequentially stacked, wherein spaces are between the organic insulating layer and respective side surfaces of the third metal layer.

* * * * *